US012590993B2

(12) United States Patent
Wu et al.

(10) Patent No.: US 12,590,993 B2
(45) Date of Patent: Mar. 31, 2026

(54) ELECTRICAL DETECTION METHOD

(71) Applicant: SILICONWARE PRECISION INDUSTRIES CO., LTD., Taichung (TW)

(72) Inventors: Chun-Yi Wu, Taichung (TW); Cheng-Tsai Hsieh, Taichung (TW); Cheng-Shao Chen, Taichung (TW); Meng-Chieh Liao, Hsinchu (TW); Yu-Hsiang Nien, Taichung (TW)

(73) Assignee: SILICONWARE PRECISION INDUSTRIES CO., LTD., Taichung City (TW)

( * ) Notice: Subject to any disclaimer, the term of this patent is extended or adjusted under 35 U.S.C. 154(b) by 247 days.

(21) Appl. No.: 18/608,686

(22) Filed: Mar. 18, 2024

(65) Prior Publication Data

US 2025/0147071 A1 May 8, 2025

(30) Foreign Application Priority Data

Nov. 2, 2023 (TW) ................................. 112142267

(51) Int. Cl.
*G01R 1/073* (2006.01)
*H01L 23/00* (2006.01)

(52) U.S. Cl.
CPC .......... *G01R 1/07342* (2013.01); *H01L 24/05* (2013.01); *H01L 24/13* (2013.01); *H01L 2224/0401* (2013.01); *H01L 2224/13* (2013.01)

(58) Field of Classification Search
CPC .. G01R 31/52; G01R 31/3842; G01R 31/389; H01R 12/716; H01R 13/6658; H01R 12/714; H01R 31/06; H01R 13/502; H01R 12/724; H01R 12/57; H01R 13/514; H01L 2924/15311; H01L 2924/14; H01L 2224/73265; H01L 24/16; H01L 2224/48227; H01L 24/48; H01L 24/13; H01L 25/0657; H01L 2224/16227; H01L 2224/73204; H01L 24/05; H01L 24/81; H01L 24/83; H01L 23/49838; H01L 24/97; H01L 2224/32145; H01L 24/49; H01L 24/29; H01L 23/49822; H01L 2225/06513; H01L 23/5386; H01L 2224/73253;

(Continued)

(56) References Cited

U.S. PATENT DOCUMENTS

| 8,618,827 | B2 * | 12/2013 | Shao | H01L 22/34 |
| | | | | 438/18 |
| 9,372,227 | B2 * | 6/2016 | Wang | G01R 31/2889 |
| 11,782,085 | B2 * | 10/2023 | Lim | H01L 25/50 |
| | | | | 324/762.06 |

* cited by examiner

*Primary Examiner* — Vinh P Nguyen
(74) *Attorney, Agent, or Firm* — Studebaker Brackett PLLC

(57) ABSTRACT

An electrical detection method provides a wiring structure including a base material body and a plurality of contact portions bonded to the base material body. Each of the contact portions includes an electrical detection pad exposed from a surface of the base material body, an electrical auxiliary pad exposed from the surface of the base material body, and a conductor that electrically connects the electrical detection pad and the electrical auxiliary pad. When probes of a detection device are connected to the contact portions, each of the probes exerts a force on the electrical detection pad and the electrical auxiliary pad of each of the contact portions at the same time, so that the contact force between the probes and the contact portions is enhanced to facilitate the electrical testing.

10 Claims, 12 Drawing Sheets

(58) Field of Classification Search
CPC ... H01L 21/486; H01L 24/20; H01L 23/5384;
H01L 23/3114; H01L 2224/16235; H01L
23/49833; H01L 2224/16238; H01L
24/02; H01L 2225/1035; H01L
2224/73203; H01L 2225/06517; H01L
2224/16; H01L 2225/1058; H01L
21/4853; H01L 24/17; H01L 24/14; H01L
2224/81191; H01L 2224/16237; H01L
2224/81; H01L 24/75; H01L 2224/13022;
H01L 2224/81193; H01L 2224/13025;
H01L 2224/16146
See application file for complete search history.

ELECTRICAL DETECTION METHOD

BACKGROUND

1. Technical Field

The present disclosure relates to a detection method, and more particularly, to an electrical detection method suitable for electronic devices.

2. Description of Related Art

In order to ensure the continued miniaturization and multi-function of electronic products and communication equipment, semiconductor packaging needs to develop towards miniaturization in order to facilitate the connection of multiple pins. To this end, the industry has developed many advanced process packaging technologies. With the advancement of technological development and in response to changes in electronic products, the industry has developed various types of test probe cards for testing electronic devices such as semiconductor chips or package modules.

Traditional probe card manufacturing methods have limited probe sizes and high manufacturing costs, so many bottlenecks need to be overcome in the process of manufacturing probes. At present, the size of the semiconductor chip tends to be miniaturized and the semiconductor chip has more and more output contacts. In addition, the test probe structure is composed of tiny probes wired one after another. Therefore, it is necessary to continuously improve and overcome the manufacturing technology of the probe structure to cope with the miniaturization of semiconductor chips, and to overcome the problems that the traditional probe structure is prone to fatigue during operation and the probe size is limited, in order to comply with the trend of modern technological products.

FIG. 1 is a schematic cross-sectional view illustrating a conventional electrical detection method. As shown in FIG. 1, a substrate structure 1 is first provided, in which a substrate body 10 is provided with a plurality of electrical contact pads 12 of micro pad (commonly known as μ-pad) specifications, wherein a conductive bump 19*a* is formed on each of the electrical contact pads 12 to form a contact 19, and then a plurality of probes 70 of a detection device 7 are connected to a plurality of the conductive bumps 19*a* to perform electrical detection operations.

However, in the conventional electrical detection method, the probe 70 only contacts a single contact 19, resulting in insufficient contact force between the probe 70 and the contact 19, thereby resulting in the inability to perform electrical testing.

Furthermore, when a single contact 19 fails, the entire substrate structure 1, or even the entire semiconductor package or electronic product, often needs to be scrapped. This results in a large amount of material waste, making it difficult to reduce the cost of semiconductor packages or electronic products.

Therefore, how to overcome the various problems of the prior art has become an urgent issue to be solved.

SUMMARY

In view of the various deficiencies of the prior art, the present disclosure provides an electrical detection method, which comprises: providing a wiring structure including a base material body and a plurality of contact portions bonded to the base material body, wherein each of the contact portions includes an electrical detection pad exposed from a surface of the base material body, an electrical auxiliary pad exposed from the surface of the base material body, and a conductor that electrically connects the electrical detection pad and the electrical auxiliary pad; and connecting probes of a detection device to the contact portions, so that each of the probes exerts a force on the electrical detection pad and the electrical auxiliary pad of each of the contact portions at the same time.

In the aforementioned electrical detection method, the base material body is provided with a plurality of electrical contact pads on the surface of the base material body. For example, a conductive bump is formed on each of the electrical contact pads.

In the aforementioned electrical detection method, the conductor is a conductive trace exposed from the surface of the base material body.

In the aforementioned electrical detection method, the conductor is a conductive trace embedded in the base material body.

In the aforementioned electrical detection method, at least two of the plurality of contact portions are electrically connected to each other via a wiring layer bonded to the base material body.

In the aforementioned electrical detection method, each of the contact portions includes a plurality of the electrical auxiliary pads, and the conductor is electrically connected to the electrical detection pad and the plurality of electrical auxiliary pads.

In the aforementioned electrical detection method, conductive bumps are formed on the electrical detection pad and the electrical auxiliary pad, and the probes contact the conductive bumps.

In the aforementioned electrical detection method, each of the probes has a width of at least 55 microns.

In the aforementioned electrical detection method, a distance between two adjacent probes of the detection device is at least 80 microns.

As can be seen from the above, in the electrical detection method of the present disclosure, the contact portion mainly includes an electrical detection pad and an electrical auxiliary pad, so that the detection device needs to widen the width of the probe to apply a force on the electrical detection pad and the electrical auxiliary pad at the same time. Therefore, compared with the prior art, the probe in the electrical detection method of the present disclosure needs to exert a force on the electrical detection pad and the electrical auxiliary pad, so that the contact force between the probe and the contact portion can be enhanced to facilitate the electrical testing.

Furthermore, via the design of the electrical auxiliary pad, when the electrical detection pad fails, the probe of the detection device can still electrically conduct the contact portion. Therefore, there is no need to scrap the entire wiring structure to avoid wasting a large amount of material. Therefore, compared with the prior art, the electrical detection method of the present disclosure can effectively reduce the cost of semiconductor packages or electronic products.

BRIEF DESCRIPTION OF THE DRAWINGS

FIG. 2A-1 is a schematic top view of a wiring structure used in an electrical detection method according to a first embodiment of the present disclosure.

FIG. 2A-2 is a schematic cross-sectional view illustrating the electrical detection method according to the first embodiment of the present disclosure.

FIG. 2B-1 is a schematic cross-sectional view of another aspect of FIG. 2A-1.

FIG. 2B-2 is a schematic cross-sectional view of another aspect of FIG. 2A-2.

DETAILED DESCRIPTION

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "on," "upper," "one," "a" and the like are merely for clear explanation rather than limiting the practicable scope of the present disclosure, and thus, alterations or adjustments of the relative relationships thereof without essentially altering the technical contents should still be considered in the practicable scope of the present disclosure.

Figure 1:
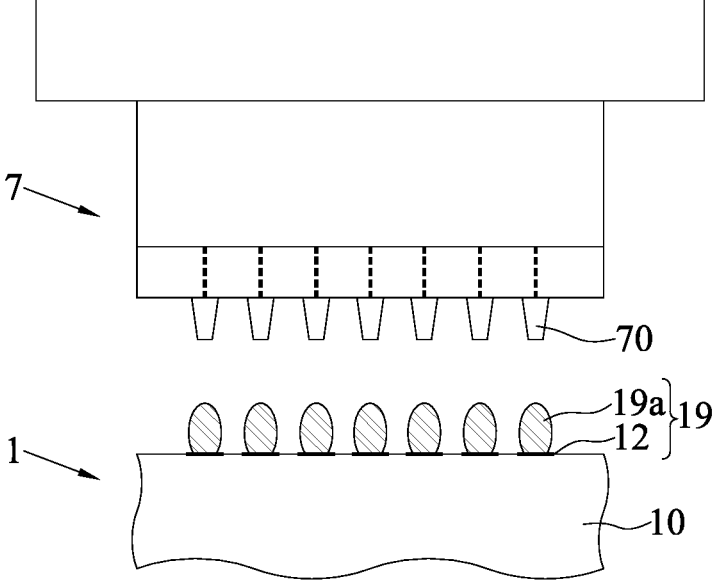
FIG. 1 is a schematic cross-sectional view illustrating a conventional electrical detection method.
Figures 1, 2A:
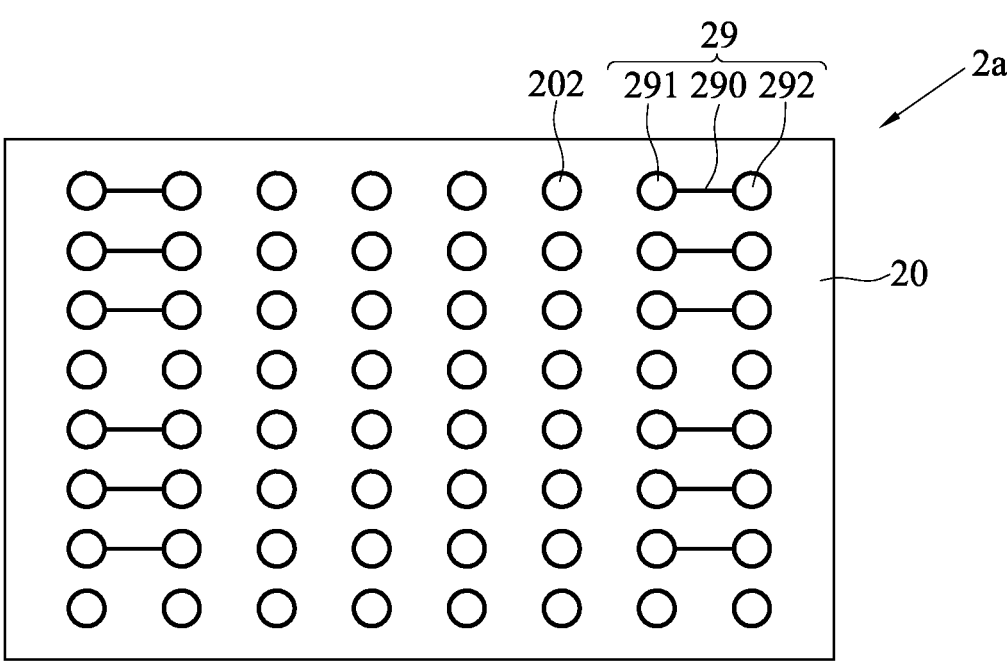

FIG. 2A-1 is a schematic top view of a wiring structure 2a used in an electrical detection method according to a first embodiment of the present disclosure. As shown in FIG. 2A-1, the wiring structure 2a comprises a base material body 20 and a plurality of contact portions 29 bonded to the base material body 20, wherein each of the contact portions 29 includes an electrical detection pad 291 exposed from the surface of the base material body 20, an electrical auxiliary pad 292 exposed from the surface of the base material body 20, and a conductor 290 electrically connecting the electrical detection pad 291 and the electrical auxiliary pad 292.

The base material body 20 is made of insulating material, like dielectric materials such as polybenzoxazole (PBO), polyimide (PI), prepreg (PP), etc., or solder resist materials such as solder mask (e.g., green solder mask), graphite (e.g., ink), etc. Alternatively, the base material body 20 can also be made of semiconductor material, such as silicon or glass, but the present disclosure is not limited to as such.

Figures 2, 2A:
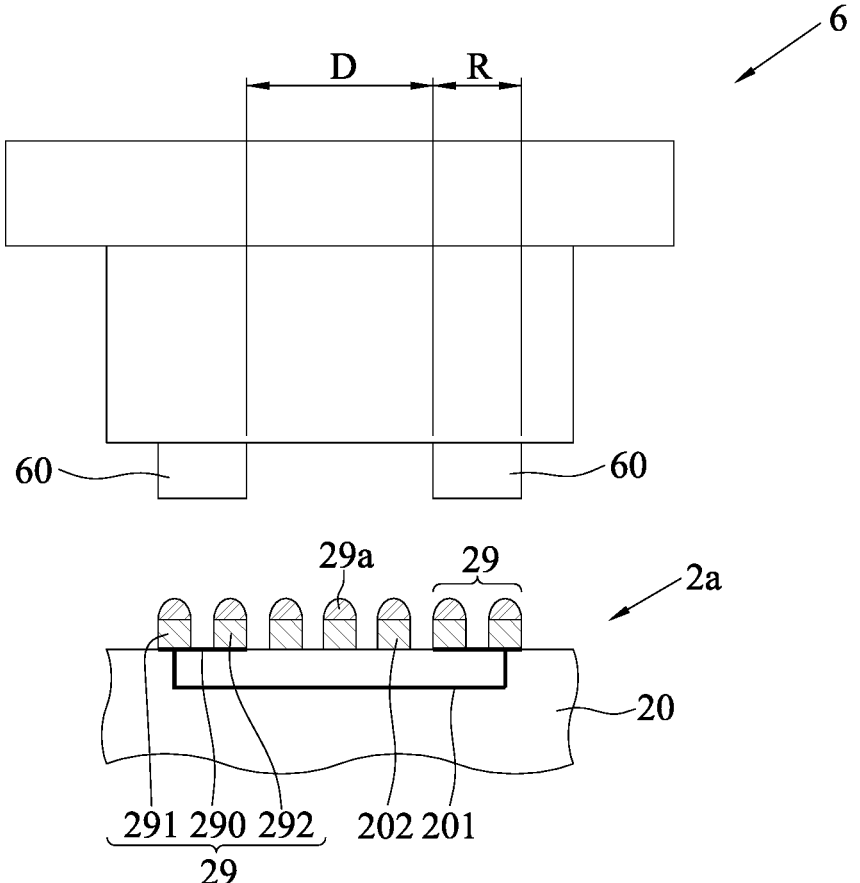

In one embodiment, a plurality of electrical contact pads 202 can be disposed on the surface of the base material body 20, such as copper micro pads (micro pads, commonly known as µ-pads) specifications, and a wiring layer 201 can be formed inside the base material body 20, as shown in FIG. 2A-2. For example, a redistribution layer (RDL) process can be used to manufacture the wiring layer 201 and the electrical contact pads 202.

Each of the contact portions 29 (including the electrical detection pad 291, the electrical auxiliary pad 292 and the conductor 290) is made of copper and is disposed on the surface of the base material body 20, and any two of the contact portions 29 can be electrically connected to each other via the wiring layer 201 or other electronic elements.

In one embodiment, each of the contact portions 29 is manufactured using the RDL process. For example, the contact portions 29 and the electrical contact pads 202 are fabricated in the same RDL process.

Furthermore, the conductor 290 is a conductive trace exposed from the surface of the base material body 20 and is electrically connected to the wiring layer 201. Alternatively, in a wiring structure 2b shown in FIG. 2B-1 and FIG. 2B-2, a conductor 293 can also be a conductive trace embedded in the base material body 20, and the conductor 293 can be produced together with the wiring layer 201 using the RDL process, wherein the base material body 20 includes a plurality of insulating layers 200 to facilitate the production of the conductor 293 and the wiring layer 201.

In addition, the electrical detection pad 291, the electrical auxiliary pad 292 and the electrical contact pad 202 can be externally connected to other elements via conductive bumps 29a such as metal bumps or solder bumps, as shown in FIG. 2A-2. For example, an under-bump metallization (UBM) layer 29b can be formed on the electrical detection pad 291, the electrical auxiliary pad 292 and the electrical contact pad 202, as shown in FIG. 2B-1, so as to facilitate the bonding of the conductive bumps 29a.

Figures 1, 2B:
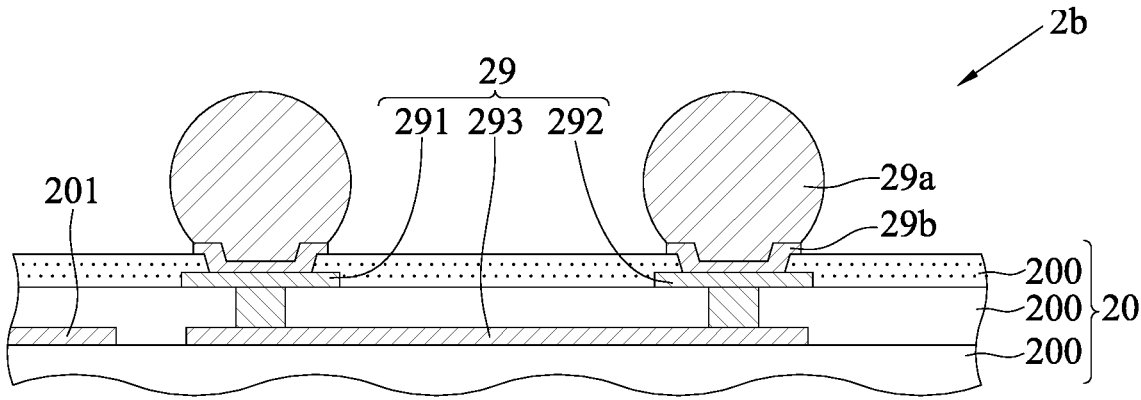
Figures 2, 2B:
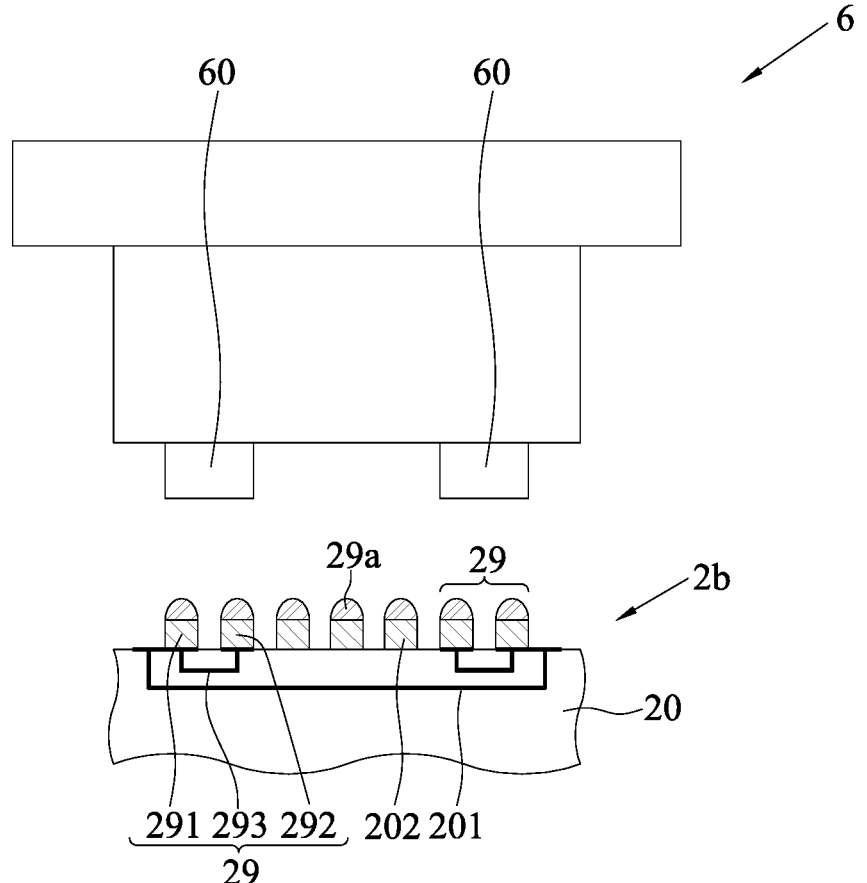

As shown in FIG. 2A-2 or FIG. 2B-2, when performing electrical detection operations, a plurality of probes 60 of a detection device 6 can be connected to two sets of contact portions 29 that are electrically connected to each other, so that a single probe 60 is aligned with two conductive bumps 29a on a single contact portion 29 (including an electrical detection pad 291 and an electrical auxiliary pad 292), that is, a single probe 60 contacts the two conductive bumps 29a at the same time to apply a force on the electrical detection pad 291 and the electrical auxiliary pad 292 to perform a random inspection-type electrical detection operation.

In one embodiment, a width R of each of the probes 60 of the detection device 6 is at least 55 microns (µm), and a distance D between two adjacent probes 60 is at least 80 microns.

Therefore, the electrical detection method of the present disclosure mainly relies on the design of the electrical auxiliary pad 292, so that one contact portion 29 includes two pads (the electrical detection pad 291 and the electrical auxiliary pad 292). Therefore, it helps to apply a force on the electrical detection pad 291 and the electrical auxiliary pad 292, so that the contact force between the probe 60 and the contact portion 29 is enhanced, thereby facilitating the electrical testing.

Furthermore, via the design of the electrical auxiliary pad 292, when the electrical detection pad 291 fails, the probe 60 of the detection device 6 can still electrically conduct the contact portion 29, so there is no need to scrap the entire wiring structure 2a, 2b, thereby avoiding a large waste of material.

Figure 2C:
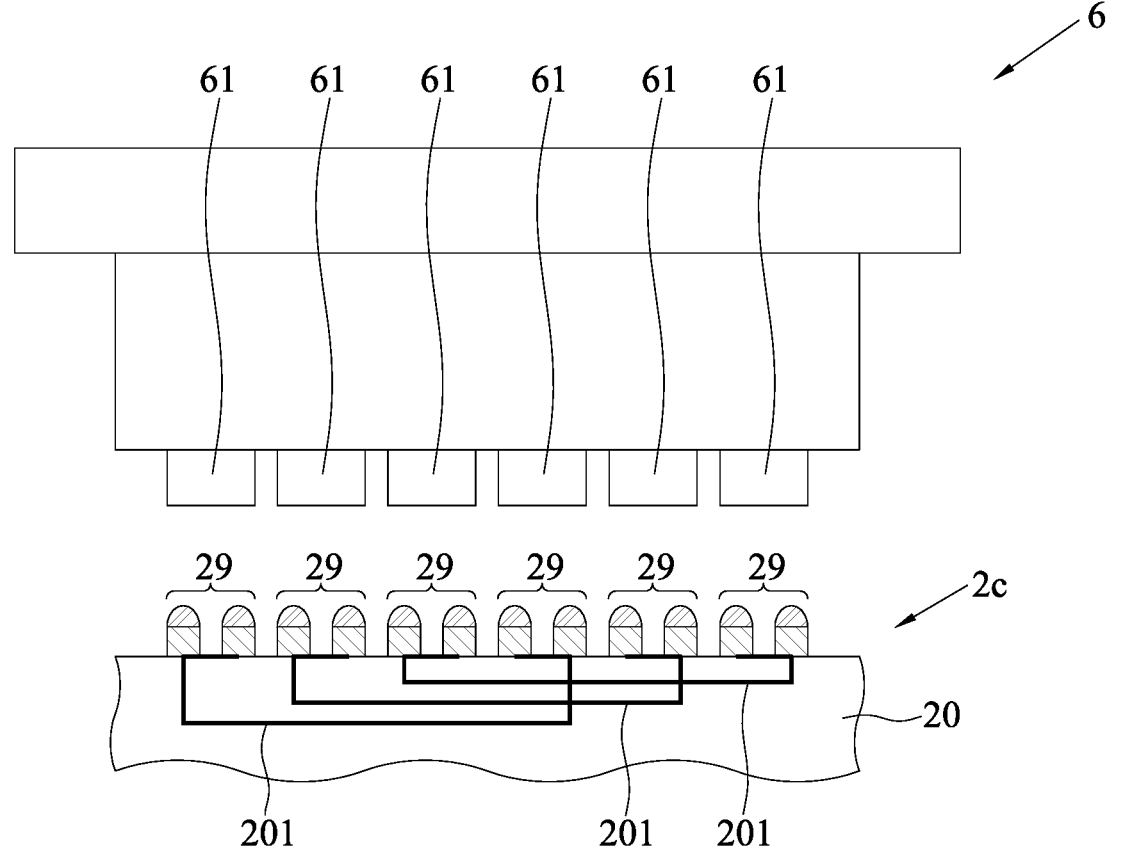
FIG. 2C is a schematic cross-sectional view of another aspect of FIG. 2A-2.

In addition, as shown in FIG. 2C, if all the contact portions 29 of a wiring structure 2c are connected in pairs, then the detection device 6 can simultaneously connect more probes 61 to all contact portions 29 to perform a comprehensive electrical detection operation.

Figure 3A:
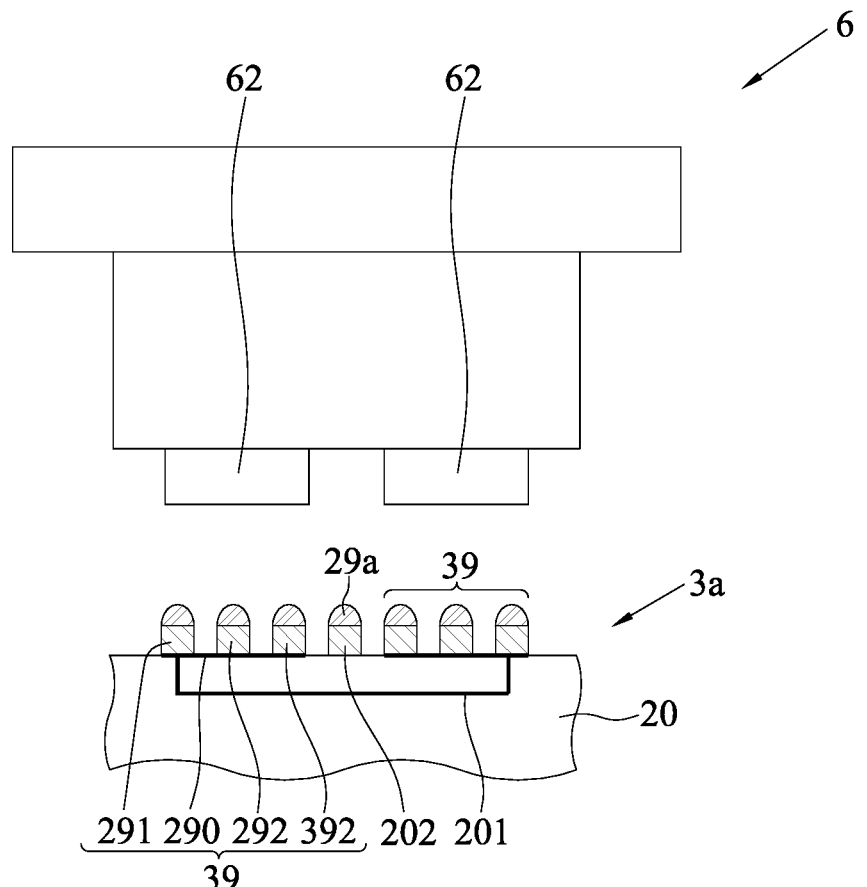
FIG. 3A is a schematic cross-sectional view illustrating the electrical detection method according to a second embodiment of the present disclosure.

FIG. 3A is a schematic cross-sectional view illustrating an electrical detection method according to a second embodiment of the present disclosure. The difference between the second embodiment and the first embodiment lies in the combination of contact portions 39 of a wiring structure 3a. The other designs are generally the same, so the similarities will not be described again below.

As shown in FIG. 3A, the contact portion 39 includes an electrical detection pad 291 exposed from the surface of the base material body 20, a plurality of electrical auxiliary pads 292, 392 exposed from the surface of the base material body 20, and a conductor 290 connecting the electrical detection pad 291 and each of the electrical auxiliary pads 292, 392.

Figure 3B:
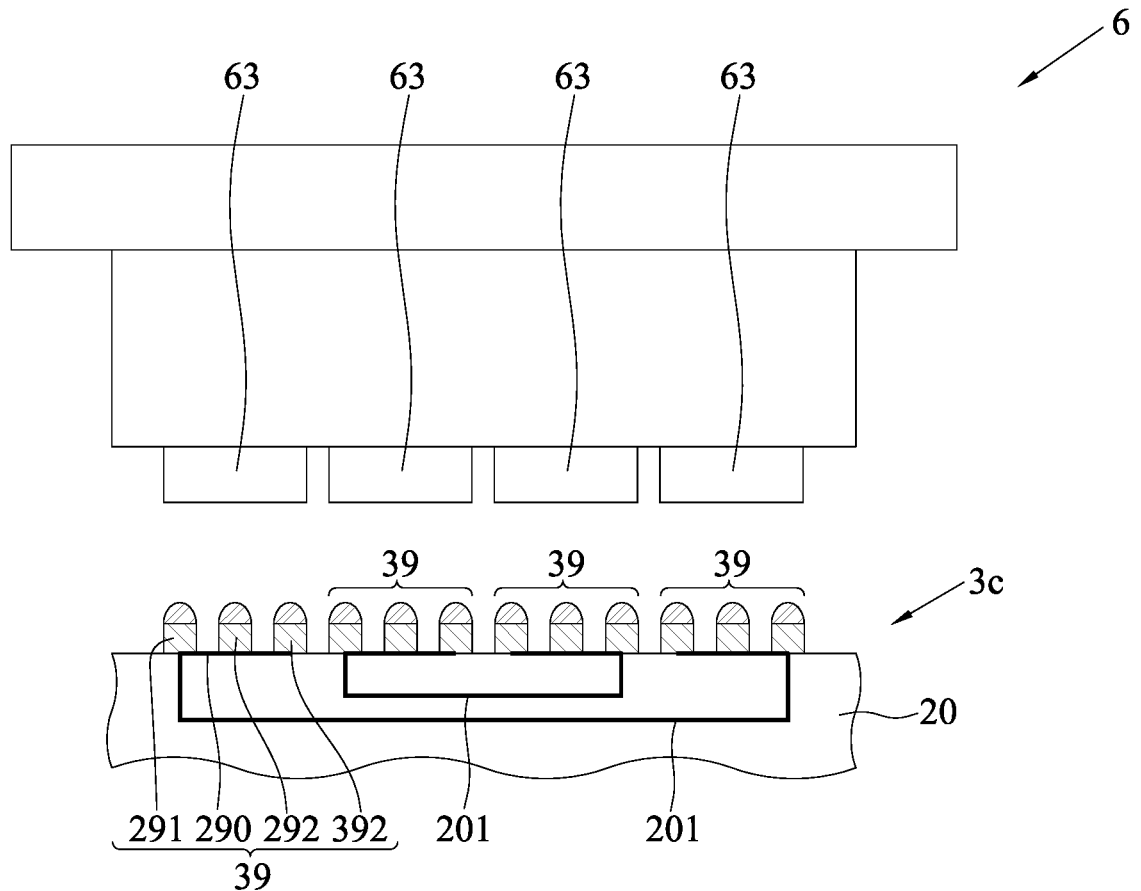
FIG. 3B is a schematic cross-sectional view of another aspect of FIG. 3A.

Therefore, when performing electrical detection operations, a plurality of probes 62 of the detection device 6 can be connected to two sets of contact portions 39 that are electrically connected to each other, so that a single probe 62 is aligned with three conductive bumps 29a on a single contact portion 39 (including an electrical detection pad 291 and two electrical auxiliary pads 292, 392), that is, a single probe 62 contacts the three conductive bumps 29a at the same time to apply a force on the electrical detection pad 291 and the plurality of electrical auxiliary pads 292, 392 to perform random inspection-type electrical detection operations. As shown in FIG. 3B, it should be understood that if all the contact portions 39 of a wiring structure 3c are connected in pairs, then the detection device 6 can simultaneously connect more probes 63 to all contact portions 39 to perform a comprehensive electrical detection operation.

FIG. 4A to FIG. 4E are schematic cross-sectional views illustrating an electrical detection method of the present disclosure applied to a manufacturing process of an electronic package 4.

Figure 4A:
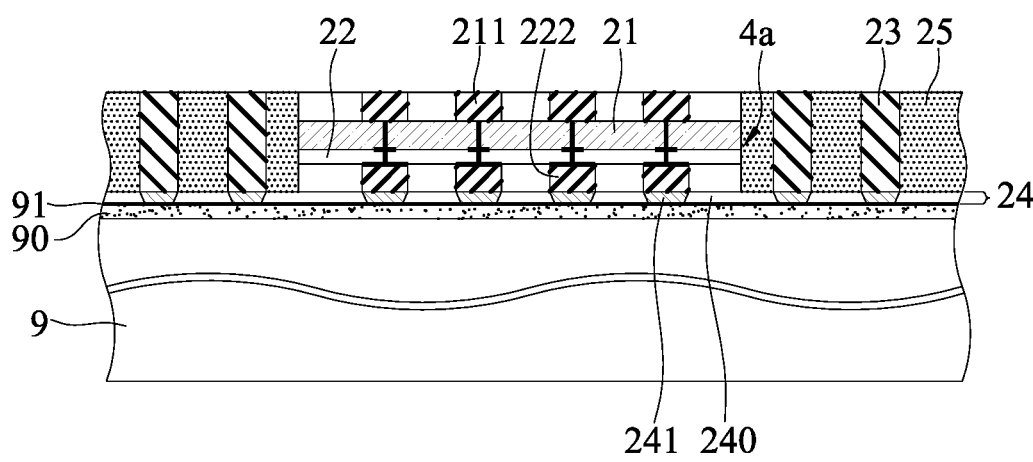
FIG. 4A to FIG. 4E are schematic cross-sectional views illustrating an electrical detection method of the present disclosure applied to a manufacturing process of an electronic package.

As shown in FIG. 4A, a carrier 9 is provided, and at least one electronic structure 4a and a plurality of conductive pillars 23 are arranged on the carrier 9. Next, a cladding layer 25 is formed on a carrier structure 24, so that the cladding layer 25 covers the electronic structure 4a and the conductive pillars 23.

The carrier 9 is, for example, a board made of semiconductor material (such as silicon or glass), on which a release layer 90 and a metal layer 91 made of such as titanium/copper are sequentially formed by, for example, coating, so as to form the carrier structure 24 on the metal layer 91.

The carrier structure 24 includes at least one dielectric layer 240 and a circuit layer 241 bonded to the dielectric layer 240.

In one embodiment, the dielectric layer 240 is made of a material such as polybenzoxazole (PBO), polyimide (PI), prepreg (PP), or other dielectric materials, and the circuit layer 241 and the dielectric layer 240 can be formed using an RDL process.

The electronic structure 4a includes an electronic body 21 having a semiconductor substrate and a circuit portion 22 bonded to the electronic body 21, and the electronic body 21 is formed with a plurality of conductive vias therein, wherein a plurality of conductive bumps 211, 222 electrically connected to the conductive vias and/or the circuit portion 22 can be formed according to requirements.

In one embodiment, the circuit portion 22 of the electronic structure 4a is disposed on the circuit layer 241 of the carrier structure 24 via the plurality of conductive bumps 222.

The conductive pillars 23 are disposed on the carrier structure 24 and are electrically connected to the circuit layer 241.

In one embodiment, the conductive pillars 23 are made of a metal material such as copper or a solder material. For example, the conductive pillars 23 are formed by electroplating on the circuit layer 241 via exposure and development.

The cladding layer 25 is made of an insulating material, such as polyimide (PI), dry film, encapsulation colloid such as epoxy resin, or molding compound. For example, the cladding layer 25 may be formed on the carrier structure 24 by liquid compound, injection, lamination, or compression molding.

In one embodiment, the outer surface of the cladding layer 25 can be flush with end surfaces of the conductive pillars 23 and end surfaces of the conductive bumps 211 by a leveling process, so that the end surfaces of the conductive pillars 23 and the end surfaces of the conductive bumps 211 are exposed from the outer surface of the cladding layer 25. For example, the leveling process removes part of the material of the conductive pillars 23, part of the material of the conductive bumps 211 and part of the material of the cladding layer 25 via grinding.

Figure 4B:
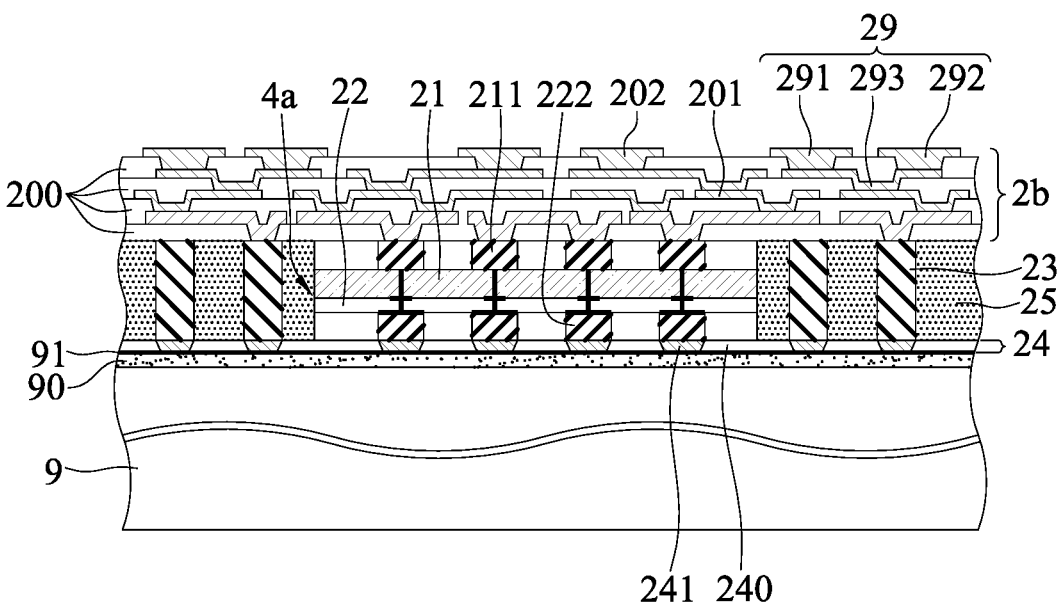

As shown in FIG. 4B, a wiring structure 2b is formed on the cladding layer 25, so that the wiring structure 2b is electrically connected to the plurality of conductive pillars 23 and the plurality of conductive bumps 211.

In one embodiment, the wiring structure 2b adopts the design shown in FIG. 2B-1, wherein the outermost insulating layer 200 can be used as a solder resist layer, and the outermost wiring layer 201 is exposed from the solder resist layer to serve as an electrical detection pad 291, an electrical auxiliary pad 292 and an electrical contact pad 202, such as micro pad (commonly known as μ-pad) specifications.

Furthermore, the material for forming the wiring layer 201 is copper, and the material for forming the insulating layer 200 is a dielectric material such as polybenzoxazole (PBO), polyimide (PI), prepreg (PP), etc., or a solder resist material such as solder mask (e.g., green solder mask), graphite (e.g., ink), etc.

Figure 4C:
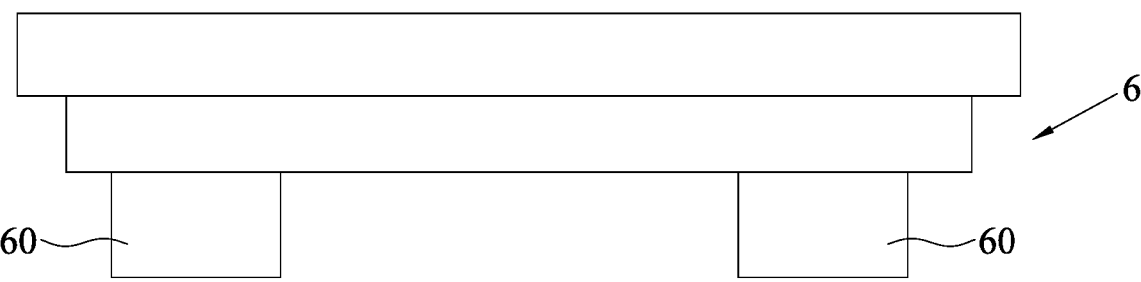
Figure 4C:
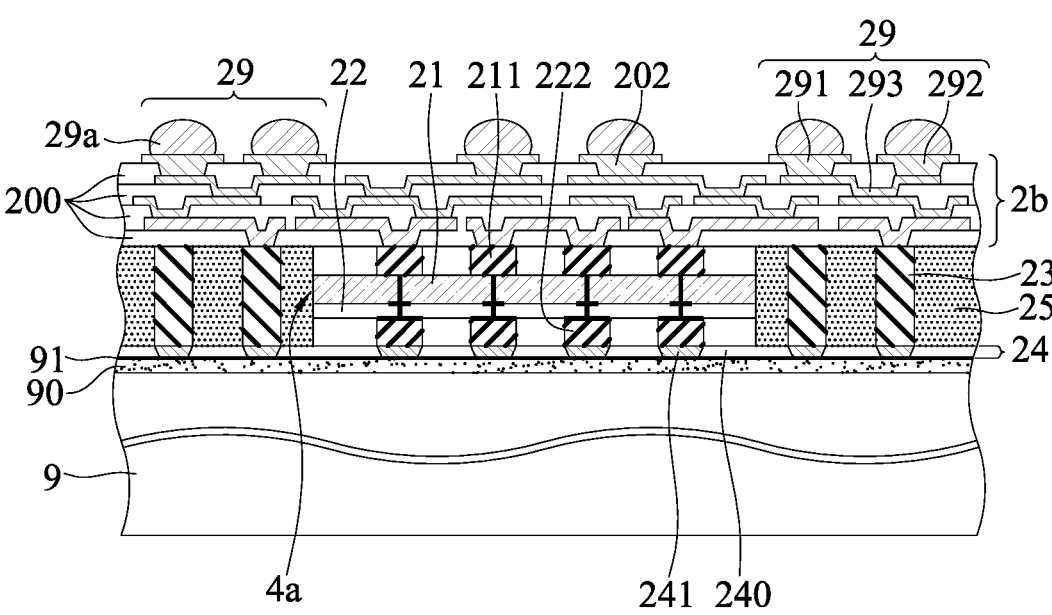

As shown in FIG. 4C, the electrical detection operation is carried out to connect the probes 60 of the detection device 6 to two sets of contact portions 29 that are electrically connected to each other, so that a single probe 60 exerts a force on a single contact portion 29 including the electrical detection pad 291 and the electrical auxiliary pad 292 at the same time to perform random inspection-type electrical detection operations.

In one embodiment, the conductive bumps 29a can be bonded onto the electrical detection pad 291, the electrical auxiliary pad 292 and the electrical contact pad 202, and then the electrical detection operation is performed, so that the single probe 60 contacts the two conductive bumps 29a at the same time to apply a force on the electrical detection pad 291 and the electrical auxiliary pad 292.

Figure 4D:
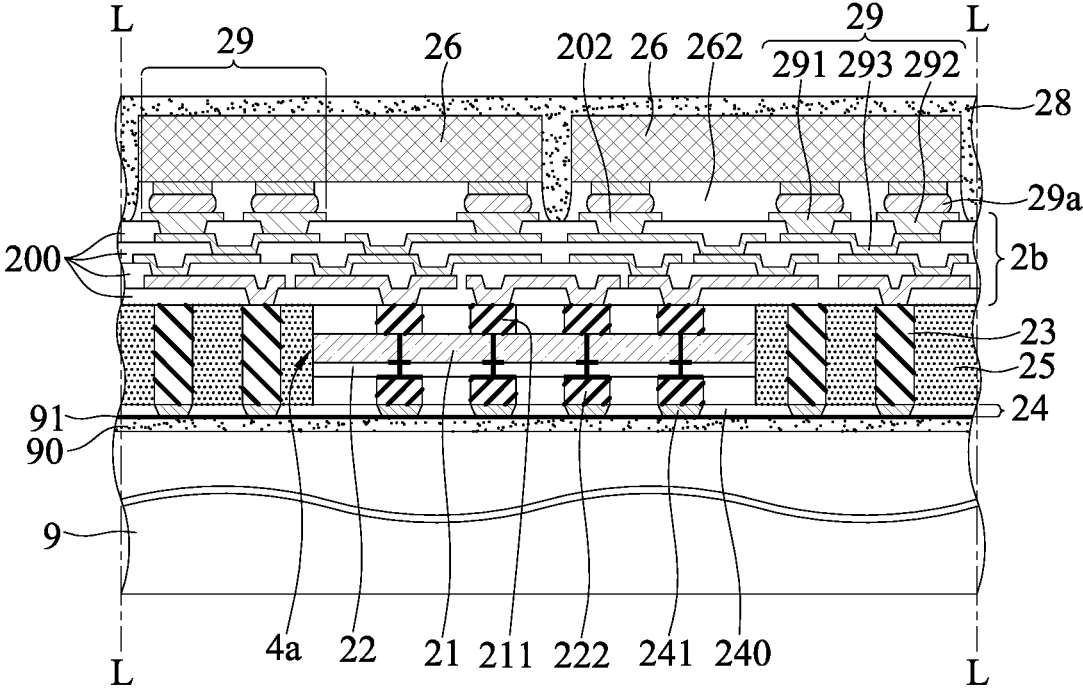

As shown in FIG. 4D, a plurality of electronic elements 26 are disposed on the wiring structure 2b, and then an encapsulation layer 28 is used to cover the electronic elements 26.

In one embodiment, each of the electronic elements 26 is an active element, a passive element, or a combination of the active element and the passive element, wherein the active element is, for example, a semiconductor chip, and the passive element is, for example, a resistor, a capacitor, or an inductor. In one implementation, each of the electronic elements 26 is, for example, a semiconductor chip such as a graphics processing unit (GPU) or a high bandwidth memory (HBM), and the electronic structure 4a serves as a bridge die and is electrically connected to the wiring structure 2b via the conductive bumps 211, thereby electrically bridging at least two electronic elements 26.

Furthermore, each of the electronic elements 26 is electrically connected to the electrical contact pads 202 and the contact portions 29 via the conductive bumps 29*a*.

In addition, the encapsulation layer 28 is made of an insulating material, such as polyimide (PI), dry film, encapsulation colloid such as epoxy resin, or molding compound, and the encapsulation layer 28 can be formed on the wiring structure 2*b* by lamination or molding. It should be understood that the material for forming the encapsulation layer 28 may be the same as or different from the material of the cladding layer 25.

In addition, an underfill 262 can be formed first between the electronic elements 26 and the wiring structure 2*b* to cover the conductive bumps 29*a*, and then the encapsulation layer 28 is formed to cover the underfill 262 and the electronic elements 26. Alternatively, in other embodiments, the encapsulation layer 28 can cover the electronic elements 26 and the conductive bumps 29*a* at the same time without forming the underfill 262.

Therefore, via the design of the electrical auxiliary pad 292, the probe 60 of the detection device 6 can contact the two conductive bumps 29*a* to apply a force on the electrical detection pad 291 and the electrical auxiliary pad 292. Therefore, the contact force between the probe 60 and the contact portion 29 can be enhanced, thereby facilitating electrical testing.

Figure 4E:
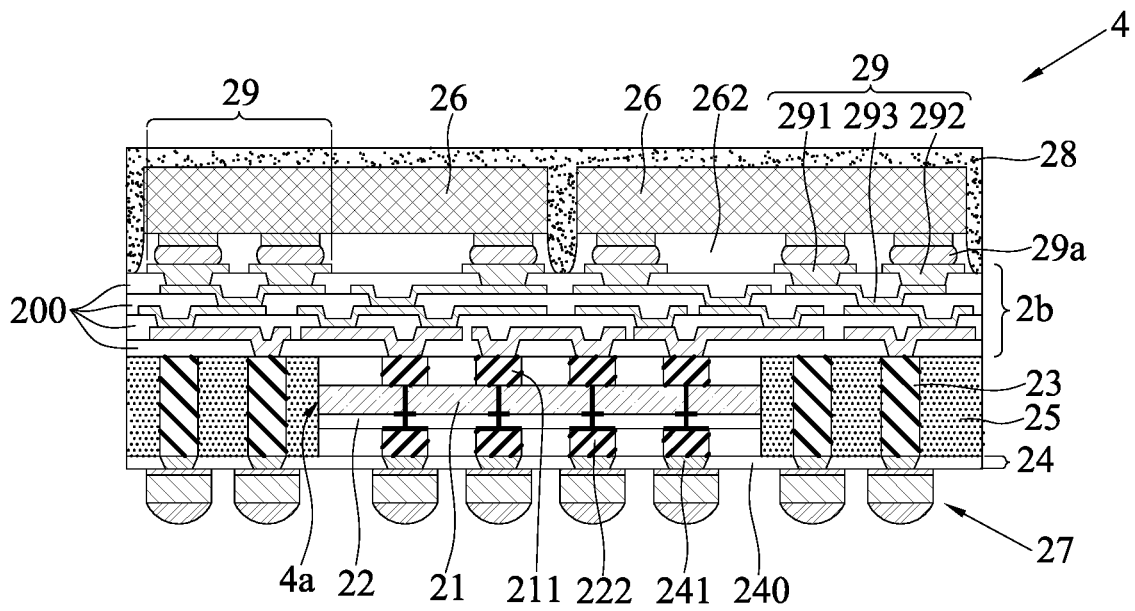

As shown in FIG. 4E, the carrier 9 and the release layer 90 thereon are removed, and then the metal layer 91 is removed to expose the carrier structure 24. After that, a singulation process is performed along a cutting path L as shown in FIG. 4D, and a plurality of conductive elements 27 are formed on the carrier structure 24, so that the conductive elements 27 are electrically connected to the circuit layer 241 to produce an electronic package 4.

In one embodiment, when peeling off the release layer 90, the metal layer 91 is used as a barrier to avoid damaging the dielectric layer 240 of the carrier structure 24, and after the carrier 9 and the release layer 90 thereon are removed, the metal layer 91 is removed by etching to expose the circuit layer 241.

Furthermore, each of the conductive elements 27 may include a metal bump made of such as copper and a solder material formed on the metal bump. It should be understood that when the number of contacts (inputs/outputs) is insufficient, a layer-adding operation can still be performed via the RDL process to reconfigure the number and position of the inputs/outputs of the carrier structure 24.

In addition, the electronic package 4 can be disposed on an electronic device (not shown) such as a package substrate or a circuit board via the conductive elements 27.

Therefore, via the design of the electrical auxiliary pad 292, when the electrical detection pad 291 fails, the probe 60 of the detection device 6 can still electrically conduct the contact portion 29. Therefore, there is no need to scrap the entire electronic package 4, and this helps reduce the cost of the electronic package 4 or subsequent electronic products.

To sum up, the electrical detection method of the present disclosure is based on the design of the electrical auxiliary pad, so that a contact portion includes an electrical detection pad and an electrical auxiliary pad. Therefore, the probe in the electrical detection method of the present disclosure will exert a force on the electrical detection pad and the electrical auxiliary pad at the same time, so that the contact force between the probe and the contact portion is enhanced, thereby facilitating the electrical testing.

Furthermore, via the design of the electrical auxiliary pad, when the electrical detection pad fails, the probe of the detection device can still electrically conduct the contact portion. Therefore, there is no need to scrap the entire wiring structure to avoid wasting a large amount of material. Therefore, compared with the prior art, the electrical detection method of the present disclosure can effectively reduce the cost of semiconductor packages or electronic products.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. An electrical detection method, comprising:
providing a wiring structure including a base material body and a plurality of contact portions bonded to the base material body, wherein each of the contact portions includes an electrical detection pad exposed from a surface of the base material body, an electrical auxiliary pad exposed from the surface of the base material body, and a conductor that electrically connects the electrical detection pad and the electrical auxiliary pad; and
connecting probes of a detection device to the contact portions, so that each of the probes exerts a force on the electrical detection pad and the electrical auxiliary pad of each of the contact portions at the same time.

2. The electrical detection method of claim 1, wherein the base material body is provided with a plurality of electrical contact pads on the surface of the base material body.

3. The electrical detection method of claim 2, wherein a conductive bump is formed on each of the electrical contact pads.

4. The electrical detection method of claim 1, wherein the conductor is a conductive trace exposed from the surface of the base material body.

5. The electrical detection method of claim 1, wherein the conductor is a conductive trace embedded in the base material body.

6. The electrical detection method of claim 1, wherein at least two of the plurality of contact portions are electrically connected to each other via a wiring layer bonded to the base material body.

7. The electrical detection method of claim 1, wherein each of the contact portions includes a plurality of the electrical auxiliary pads, and the conductor is electrically connected to the electrical detection pad and the plurality of electrical auxiliary pads.

8. The electrical detection method of claim 1, wherein conductive bumps are formed on the electrical detection pad and the electrical auxiliary pad, and the probes contact the conductive bumps.

9. The electrical detection method of claim 1, wherein each of the probes has a width of at least 55 microns.

10. The electrical detection method of claim 1, wherein a distance between two adjacent probes of the detection device is at least 80 microns.

* * * * *